United States Patent [19]
Ishihara et al.

[11] Patent Number: 5,299,151
[45] Date of Patent: Mar. 29, 1994

[54] METHOD FOR WRITING INTO SEMICONDUCTOR MEMORY

[75] Inventors: Hiroshi Ishihara, Tenri; Kenichi Tanaka, Nara; Keizo Sakiyama, Kashihara, all of Japan

[73] Assignee: Sharp Kabushiki Kaisha, Osaka, Japan

[21] Appl. No.: 716,785

[22] Filed: Jun. 18, 1991

[30] Foreign Application Priority Data

Jun. 22, 1990 [JP] Japan .................. 2-164798

[51] Int. Cl.⁵ .................. G11C 19/06; H01L 27/02
[52] U.S. Cl. .................. 365/96; 365/225.7; 257/50; 257/529; 257/530; 257/665
[58] Field of Search .................. 365/225.7, 96; 257/50, 257/530, 529, 665

[56] References Cited

U.S. PATENT DOCUMENTS

| | | | |
|---|---|---|---|
| 4,899,205 | 2/1990 | Hamdy et al. | 357/51 |
| 4,970,686 | 11/1990 | Naruke et al. | 357/51 |
| 5,119,163 | 6/1992 | Ishihara et al. | 365/96 |

OTHER PUBLICATIONS

Esmat Handy et al., "Dielectric Based Antifuse for Logic and Memory ICs"; from 1988 IEDM; pp. 786-789.

*Primary Examiner*—Andrew J. James
*Assistant Examiner*—Alice W. Tang

[57] ABSTRACT

A method is provided for writing into a semiconductor memory which includes a MOS transistor formed on a semiconductor substrate and an anti-fuse formed of an insulating film and an upper electrode on a drain of the MOS transistor. The method includes the steps of applying a first voltage between the upper electrode of the anti-fuse and a source of the MOS transistor to cause dielectric breakdown of the insulating film of the anti-fuse, with the MOS transistor turned on; and applying a second voltage between the upper electrode of the anti-fuse and the semiconductor substrate so that a larger amount of current flows than the amount of current required for breaking down the insulating film of the anti-fuse.

8 Claims, 3 Drawing Sheets

METHOD FOR WRITING INTO SEMICONDUCTOR MEMORY

BACKGROUND OF THE INVENTION

1. Field of the Invention

The present invention relates to a method for writing into a semiconductor memory, and more particularly, it relates to a method for writing into a semiconductor memory which has a memory cell composed of a MOS transistor and an anti-fuse connected to the MOS transistor in series.

2. Related Art

In recent years, as shown in FIG. 2, a PROM memory cell M is known to include an n-channel MOS transistor 8 formed on a surface of a p-type semiconductor substrate 1 and an anti-fuse 7 connected to the MOS transistor 8 in series (e.g., "Dielectric Based Anti-fuse for Logic and Memory IC", IEDM 88, pp. 786–789). The anti-fuse 7 is formed by providing a thin insulating film 10 and an upper electrode 5 on a drain 3 of the MOS transistor 8, as shown in FIG. 3. Reference numeral 2 denotes a local oxidation film for isolating the memory cell M, while numeral 4 denotes a gate electrode. When some information is written in the memory cell M, first, a positive voltage is applied to the gate electrode 4 to turn the MOS transistor 8 on. For keeping the MOS transistor 8 in an ON state, a voltage $V_p$ which can break down the thin insulating film 10 (where the voltage Vp varies depending on the thickness of the thin insulating film 10, for example, if the thickness of the thin insulating film 10 is 50 Å, 10 to 15 V is necessary to breakdown the thin insulating film 10) is applied between the upper electrode 5 of the anti-fuse 7 and a source 6 of the MOS transistor 8 in such a direction that the upper electrode 5 turns positive while the source 6 turns negative with respect to electrode 5. In other words, voltage is applied through the MOS transistor 8 to the anti-fuse 7. Then, the insulating film 10 of the anti-fuse 7 is subjected to dielectric breakdown to make the anti-fuse 7 conductive. At this stage, conventionally, the writing operation is completed.

The basic cell construction includes a MOS transistor formed on the semiconductor substrate 1 and the anti-fuse 7 connected to the upper electrode 5 with the thin insulating film 10 as an intermediate covering the MOS transistor, wherein a portion of the thin insulating film 10 lying over the drain 3 is intended to become conductive. As a result, the thin insulating film 10 lying at that portion is made thinner than the thin insulating film lying in other portions. With such a design and with the MOS transistor turned ON, an application of a voltage on the upper electrode 5 breaks down only the insulating film 10 and forms conduction therethrough, wherein a portion of the upper electrode 5 lying over the portion of the insulating film 10 acts as the anti-fuse 7. Accordingly, other memory cells which were not subjected to such writing actions are left as each upper electrode 5 is not made conductive or insulated from the drain 3.

The dielectric breakdown of the anti-fuse 7 is caused by a current in the order of a few $\mu$ amperes (where this breakdown current changes depending on the characteristics of the MOS transistors). The electrical resistance of the anti-fuse 7 after the dielectric breakdown depends upon the current at the time of the dielectric breakdown. The electric resistance is reduced as the current is increased, while the electric resistance increases as the current decreases. When voltage is applied through the MOS transistor 8 to the anti-fuse 7 in a conventional manner, merely applying the voltage $V_p$ of the order of a few volts leads to a current limit, and the reduction in the electric resistance of the anti-fuse 7 may be limited. As a result, as shown in FIG. 1(a), there arises the problem that, upon the operation of the memory cell M, a voltage-current (V-I) characteristic is shown which curves in a low current range of 5 mA or below (a part shown by an arrow in the drawing), for expressing a non-linearity of the characteristic. The problem becomes more critical as miniaturization of the MOS transistor advances more and more. Since there is a limitation to the supply voltage, the voltage $V_p$ to be applied cannot be so large.

(An anti-fuse element includes that which is disclosed in the U.S. Pat. No. 4,899,205, for example.)

SUMMARY OF THE INVENTION

Accordingly, it is an object of the present invention to provide a method for writing into a semiconductor memory, in which a voltage of a sufficient voltage to break down the insulating film of the anti-fuse enables electrical resistance of the anti-fuse to sufficiently reduce.

To attain this object, the present invention provides a method for writing into a semiconductor memory including a MOS transistor formed on a surface of a semiconductor substrate and an anti-fuse formed of an insulating film and an upper electrode on a drain of the MOS transistor, the anti-fuse becoming conductive for storing information when the voltage across the drain and the upper electrode causes dielectric breakdown of the insulating film. The method comprising the steps of applying a first voltage between the upper electrode of the anti-fuse and a source of the MOS transistor to cause dielectric breakdown of the insulating film of the anti-fuse, with the MOS transistor is turned on; and applying a second voltage between the upper electrode of the anti-fuse and the semiconductor substrate so that a larger amount of current than the amount of current required for breaking down the insulating film of the anti-fuse flows between the upper electrode of the anti-fuse and the semiconductor substrate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 2:
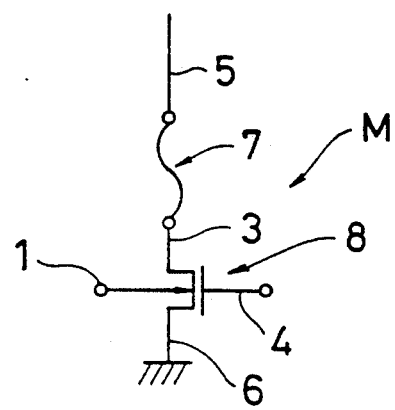
FIGS. 2 and 3 are diagrams respectively showing an equivalent circuit to and a sectional configuration of a memory cell of a PROM in which data is written.
Figure 3:
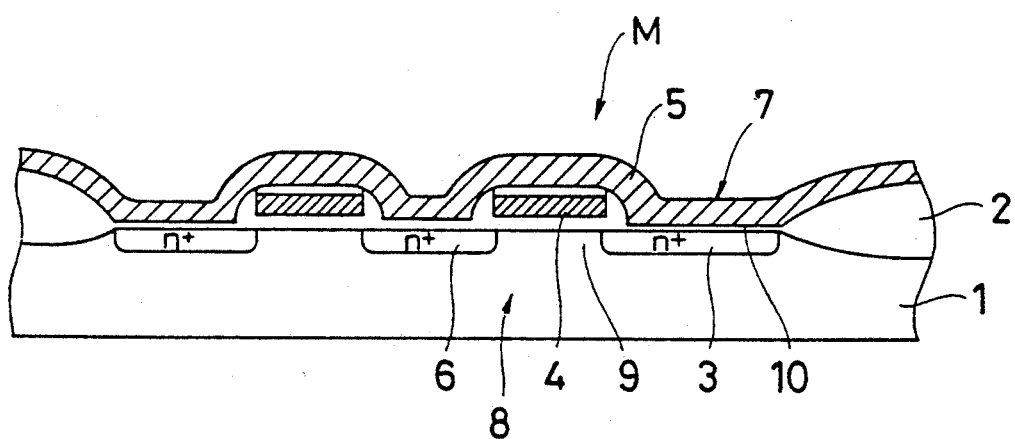
Figure 4:
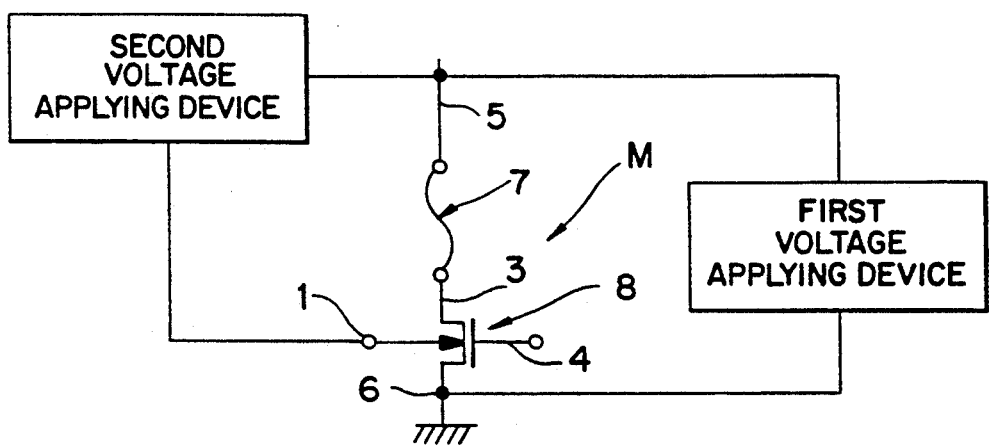
FIG. 4 illustrates an equivalent circuit and voltage applying devices for an embodiment of the present invention.

The preferred embodiments of a method for writing into a semiconductor memory according to the present invention will be described in detail, with reference to a PROM shown in FIGS. 2 and 3.

First, in the case of an n-channel MOS transistor in order to apply a specified voltage to a gate electrode 4 to turn a MOS transistor 8 on, a voltage $V_p$ which can break down the thin insulating film 10 (where the voltage Vp varies depending on the thickness of the thin insulating film 10, for example, if the thickness of the thin insulating film 10 is 50 Å, 10 to 15 V is necessary to break down the thin insulating film 10) is applied between an upper electrode 5 of an anti-fuse 7 and a source 6 of the MOS transistor 8 in such a direction that the upper electrode 5 turns to positive while the source 6 turns to negative with respect to electrode 5 in a similar manner as is. In other words, the conventional embodiments, the voltage is applied through the MOS transistor 8 to the anti-fuse 7. Then, the upper electrode 5, an insulating film 10, a drain 3, a channel 9 and the source 6 together serve as a path to allow current to flow, so that dielectric breakdown of the insulating film 10 of the anti-fuse 7 is caused to make the anti-fuse conductive.

Figure 1A:
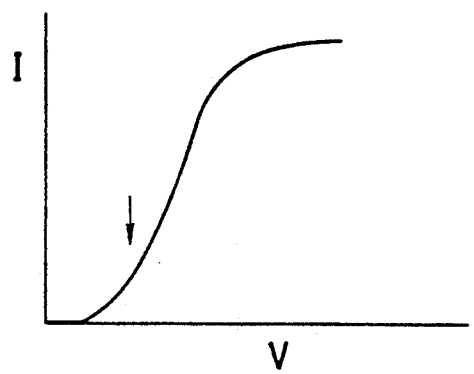
FIG. 1(a) is a diagram showing a V-I characteristic of a memory cell after the dielectric breakdown of an anti-fuse in a conventional manner.
Figure 1B:
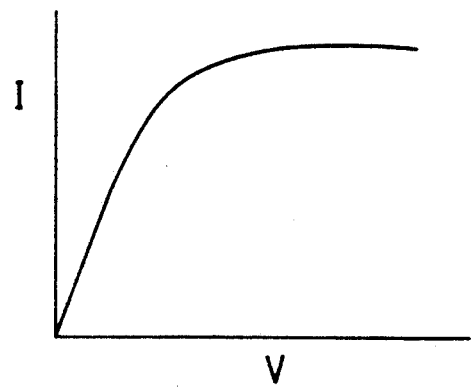
FIG. 1(b) is a diagram showing a V-I characteristic of the memory cell after the writing in accordance with a method for writing into a semiconductor memory of an embodiment of the present invention.

Second, a voltage $V_a$ of the order of a few volts is applied between the upper electrode 5 of the anti-fuse 7 and a substrate 1 in such a direction that the upper electrode 5 turns to negative while the substrate (of p-type) 1 turns to positive. Then, the substrate 1, the drain 3, the insulating film 10 having been subjected to dielectric breakdown and the upper electrode 5 together serve as a path to allow current to flow. In this case, the channel 9 of the MOS transistor 8 is not used as the path, and therefore, with the voltage of the order of a few volts, a current of the order of a few milliamperes and more can flow and the current flow sufficiently reduces the electrical resistance of the anti-fuse. Thus, as shown in FIG. 1(b), upon the operation of the memory cell M, the V-I characteristic in a low current range can be linear, and this leads the memory cell M to the normal operation.

Although the MOS transistor 8 employed in this embodiment is of the n-channel type formed on the p-type semiconductor substrate 1, the MOS transistor 8 is not limited to the n-channel type but it may be the one of the reverse polarity type. In this case, the voltage may be applied in the reverse direction to write data in the memory.

As can be apparent from the previous description, in the method for writing in to a semiconductor memory according to the present invention, an insulating film of an anti-fuse is subjected to dielectric breakdown in the same manner as in the conventional method, and thereafter, a voltage is applied between an upper electrode of the anti-fuse and a semiconductor substrate so that a larger amount of current than the amount of current required for breaking down the insulating film of the anti-fuse flows between the upper electrode of the anti-fuse and the semiconductor substrate. Therefore, with a voltage having an effective amount of volts so that, the electrical resistance of the anti-fuse can be sufficiently reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of writing into a semiconductor memory including a MOS transistor formed on a surface of a first conductivity type semiconductor substrate and an anti-fuse formed of an insulating film and an upper electrode on a drain of the MOS transistor, said MOS transistor having a source and the drain of a second conductivity type forming respective PN junctions with said semiconductor substrate, wherein the anti-fuse becomes conductive for storing data when a voltage across the drain and the upper electrode causes a dielectric breakdown of the insulating film, the method comprising the steps of:

applying a first voltage across the upper electrode of the anti-fuse and the source of the MOS transistor to cause the dielectric breakdown of the insulating film of the anti-fuse, when the MOS transistor is transistor is turned on; and applying a second voltage across the upper electrode of the anti-fuse and the semiconductor substrate so that a larger amount of a second current than an amount of a first current required for breaking down the insulating film of the anti-fuse, flows between the upper electrode of the anti-fuse and the semiconductor substrate, said second voltage being of a polarity so as to forward bias the PN junction between the drain and the semiconductor substrate.

2. A method for writing into a semiconductor memory including a MOS transistor formed on a surface of a semiconductor substrate and an anti-fuse formed of an insulating film and an upper electrode on a drain of the MOS transistor, wherein the anti-fuse becomes conductive for storing data when a voltage across the drain and the upper electrode causes a breakdown of the insulating film, the method comprising the step of:

applying a first voltage across the upper electrode of the anti-fuse and a source of the MOS transistor to cause the dielectric breakdown of the insulating film of the anti-fuse, when the MOS transistor is turned on; and subsequently applying a second voltage across the upper electrode of the anti-fuse and the semiconductor substrate such that a large amount of a second current than an amount of a first current required for breaking down the insulating film of the anti-fuse flows between the upper electrode of the anti-fuse and the semiconductor substrate, through the insulating film and the drain of the MOS transistor, said second voltage being of a polarity different from the first voltage.

3. A method according to claim 1, wherein the MOS transistor comprises an N-channel type formed on a P-type semiconductor substrate, the first voltage applies a positive potential to the upper electrode with respect to the source, the second voltage applies a negative potential to the upper electrode with respect to the semiconductor substrate.

4. A method according to claim 1, wherein the MOS transistor comprises a P-channel type formed on an N-type semiconductor substrate, the first voltage applies a negative potential to the upper electrode with respect to the source, the second voltage applies a positive potential to the upper electrode with respect to the semiconductor substrate.

5. A semiconductor memory, comprising:
a MOS transistor formed on a surface of a first conductivity type semiconductor substrate;
an anti-fuse formed of an insulating film and an upper electrode on a drain of the MOS transistor, said MOS transistor having a source and the drain of a second conductivity type forming respective PN junctions with said semiconductor substrate so that the anti-fuse becomes conductive for storing data when a voltage across the drain and the upper electrode causes a dielectric breakdown of the insulating film;
means for applying a first voltage across the upper electrode of the anti-fuse and the source of the MOS transistor to cause the dielectric breakdown of the insulating film of the anti-fuse, when the MOS transistor is turned on; and
means for applying a second voltage across the upper electrode of the anti-fuse and the semiconductor substrate so that a larger amount of a second current than an amount of a first current required for breaking down the insulating film of the anti-fuse, flows between the upper electrode of the anti-fuse and the semiconductor substrate, said second voltage being of a polarity so as to forward bias the PN junction between the drain and the semiconductor substrate.

6. A semiconductor memory according to claim 5, wherein the MOS transistor comprises an N-channel type formed on a P-type semiconductor substrate, said first voltage applies a positive potential to the upper electrode with respect to the source and said second voltage applies a negative potential to the upper electrode with respect to the semiconductor substrate.

7. A semiconductor memory according to claim 5, wherein the MOS transistor comprises a P-channel type formed on an N-type semiconductor substrate, said first voltage applies a negative potential to the upper electrode with respect to the source and said second voltage applies a positive potential to the upper electrode with respect to the semiconductor substrate.

8. A semiconductor memory, comprising:
a MOS transistor formed on a surface of a first conductivity type semiconductor substrate;
an anti-fuse formed of an insulating film and an upper electrode on a drain of the MOS transistor so that the anti-fuse becomes conductive for storing data when an application of a voltage across the drain and the upper electrode causes a dielectric breakdown of the insulating film;
means for applying a first voltage when the MOS transistor is turned on, across the upper electrode of the anti-fuse and a source of the MOS transistor to cause the dielectric breakdown of the insulating film of the anti-fuse;
means for subsequently applying a second voltage of a different polarity than the first voltage, across the upper electrode of the anti-fuse and the semiconductor substrate so that a larger amount of a second current than an amount of a first current required for breaking down the insulating film of the anti-fuse, flows between the upper electrode of the anti-fuse and the semiconductor substrate, through the insulating film and the drain of the MOS transistor.

* * * * *